(12) United States Patent
Srinivasan et al.

(10) Patent No.: US 6,442,069 B1
(45) Date of Patent: Aug. 27, 2002

(54) DIFFERENTIAL SIGNAL PATH FOR HIGH SPEED DATA TRANSMISSION IN FLASH MEMORY

(75) Inventors: Balaji Srinivasan, Fair Oaks; Robert L. Baltar, Folsom; Ritesh Trivedi, Fair Oaks, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/752,345

(22) Filed: Dec. 29, 2000

(51) Int. Cl.[7] .............................................. G11C 16/06
(52) U.S. Cl. ............................ 365/185.21; 365/185.33; 365/207
(58) Field of Search ........................ 365/185.33, 185.07, 365/205, 207, 189.11, 230.03, 185.21

(56) References Cited

U.S. PATENT DOCUMENTS

| | | | |
|---|---|---|---|
| 4,119,995 A | 10/1978 | Simko | |
| 5,341,332 A | * 8/1994 | Inoue et al. | 365/189.01 |
| 5,487,033 A | 1/1996 | Keeney et al. | |
| 5,867,430 A | * 2/1999 | Chen et al. | 365/189.04 |
| 6,005,799 A | * 12/1999 | Rao | 365/168 |
| 6,141,237 A | * 10/2000 | Eliason et al. | 365/145 |
| 6,327,185 B1 | * 12/2001 | Hirata | 365/185.2 |
| 6,359,808 B1 | * 3/2002 | Chen et al. | 365/185.21 |

* cited by examiner

*Primary Examiner*—Richard Elms
*Assistant Examiner*—Hien Nguyen
(74) *Attorney, Agent, or Firm*—Peter Lam

(57) ABSTRACT

A flash memory using a pre-sensing amplifier coupled to receive differential inputs from a pair of memory cells of said flash memory array and to generate a differential output from the pre-sensing amplifier. The differential output is coupled to a bus, which is also coupled to a post-sensing amplifier. The differential configuration on the bus allows marginal voltage differences to be detected by the post-sensing amplifier so that logic states from the flash memory can be sensed without the bus transitioning to half of the supply voltage.

18 Claims, 4 Drawing Sheets

DIFFERENTIAL SIGNAL PATH FOR HIGH SPEED DATA TRANSMISSION IN FLASH MEMORY

BACKGROUND OF THE INVENTION

1. Field of the Invention

The present invention relates to the field of memories and more particularly to a technique of providing a differential signal output from a flash memory.

2. Description of the Related Art

One type of non-volatile electrically erasable and electrically programmable read-only semiconductor memory is commonly referred to as a flash memory. Once programmed, the flash memory retains the program data until the memory is erased. In a typical flash memory structure, several blocks of flash memory are configured together on a flash memory device. A variety of flash memory devices are known in the art, but generally, a flash cell is comprised of a metal oxide semiconductor (MOS) transistor which includes an isolated or floating gate that is programmed typically by electron injection from the channel.

In one typical configuration, a flash cell is programmed by applying a high voltage (such as 12 volts) on the control gate, 0 volts on the source and an intermediate voltage such as 6 volts on the drain. A channel-hot-electron injection causes the isolated or floating gate to be negatively charged. The charged floating gate causes the threshold voltage ($V_t x$) of the device to increase. Thus, a programmed cell requires a higher threshold voltage to turn the transistor on as compared to an erased cell. In a read operation, generally, the source is grounded and a read voltage, such as 5 volts, is applied to the control gate and the output is determined at the drain. The amount of the read current at the drain determines if the device is programmed or not programmed. In order to erase the programmed cell, the drain is made to float while a voltage is impressed across the source and the control gate, such as 12 volts on the source with a grounded control gate or 5 volts on a source with a negative voltage on the control gate. When the cell is being erased, charges are removed from the floating gate to the source terminal so that the threshold voltage of the device is reduced.

In flash memories, sensing amplifiers are utilized to read the content of the flash memory arrays. These sensing amplifiers generally provide single-ended outputs onto an output bus. A common problem with single-ended outputs is that the output typically swings from ground to a rail voltage, such as $V_{cc}$. When additional memory cells are introduced, which outputs are impressed on the output line, the loading increases the capacitance coupled to the output lines. This loading, along with the significant voltage swings impacts the performance of the memory. Thus, performance, such as the speed in reading an output from a flash cell and the circuit power requirements, can degrade as more load is placed on the output.

What is needed is a technique for addressing this performance factor in flash memories.

DETAILED DESCRIPTION OF THE INVENTION

Figure 1:
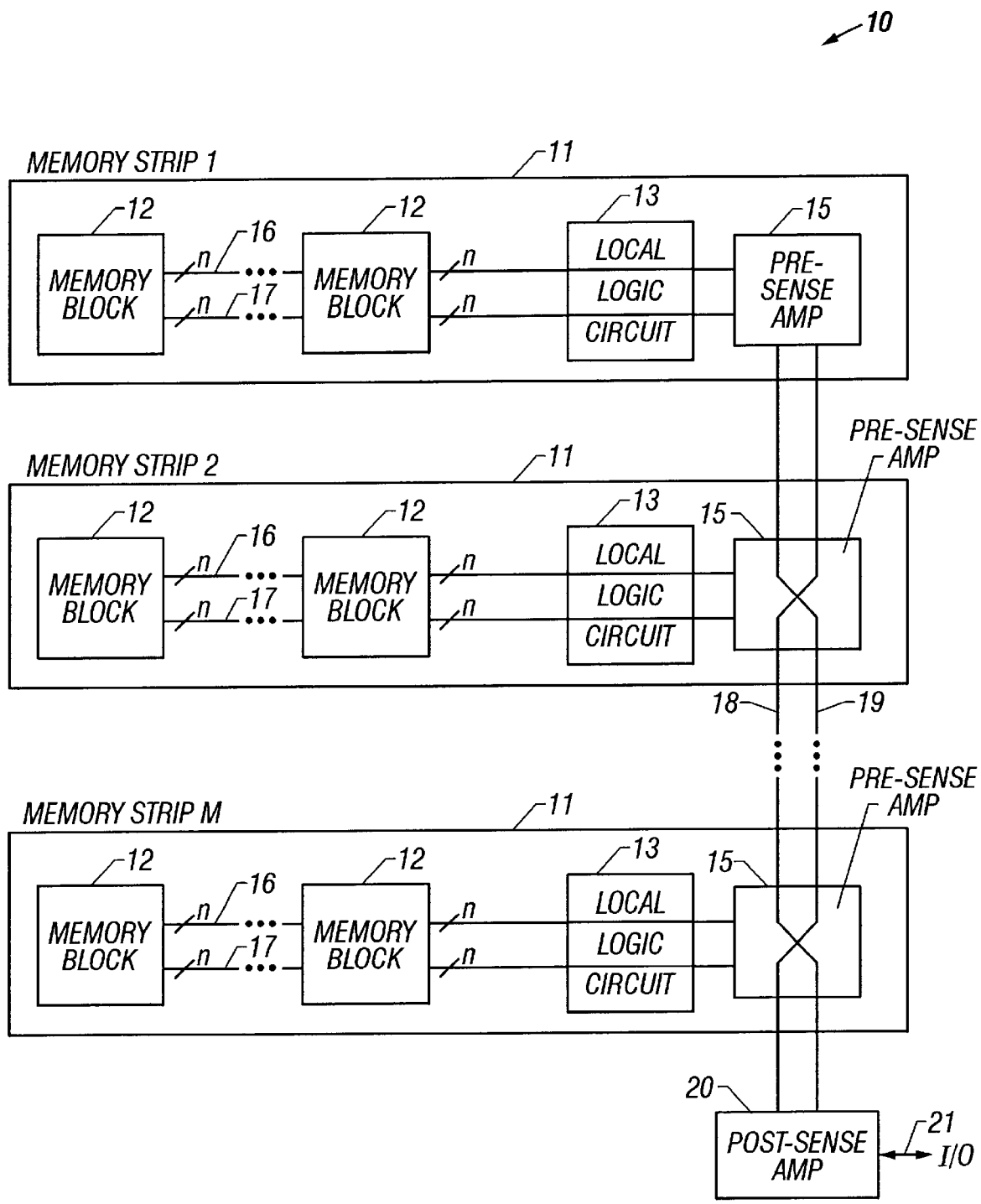
FIG. 1 is a block schematic diagram showing a flash memory device implementing the present invention in which differential sensing outputs are obtained from multiple memory strips containing flash memory.

Referring to FIG. 1, one implementation of the present invention is shown in which the particular example involves a flash memory device 10. The flash memory is a non-volatile electrically erasable and electrically programmable read-only-semiconductor memory. The example memory device 10 is comprised of a number of memory strips 11, wherein each memory strip 11 includes one or more flash memory block(s) 12. Generally, each memory block 12 is configured as an array or arrays and functions equivalently to various flash memory devices currently known in the art. The memory blocks 12 can be programmed, read and block erased according to practices known in the art pertaining to flash memory devices. In one particular embodiment, two blocks 12 are present on each strip 11 and are commonly referred to as an odd block and an even block. Each strip 11 also has a local logic circuit 13 which includes various circuitry required to access, program, read and erase memory cells of the memory block(s) 12 on each strip. A variety of circuits can be implemented to provide these functions, including those circuits known in the art.

Also present on each memory strip 11 is a pre-sensing amplifier (pre-sense amp) 15 which includes circuitry for practicing the present invention. A pair of data lines 16 and 17 are also shown coupling outputs of the memory blocks 12 to the sense amplifier 15. In typical flash configurations, data line 16 is typically comprised of a plurality of lines "n" and the lines are referred to as bit lines which emanate as column lines from an array of main memory cells, while lines 17 (line 17 is also comprised of multiple lines) are from reference cells of the flash memory array. The general configuration is not critical to the understanding of the present invention other than that two read lines pertaining to a given memory cell array are coupled to the pre-sense amplifier 15 to determine if the particular flash memory cell being read is either in a programmed state or an erased state.

In the flash memory device 10 shown in FIG. 1, the outputs of the pre-sense amplifier 15 are coupled on a pair of differential signal lines (also referred to as bus, bus lines, or sense output) 18 and 19 to a post-sensing amplifier (post-sense amp) 20. It is appreciated that the memory device 10 may have only one memory strip 11 or it may have a plurality of memory strips 11, in which the outputs from each pre-sensing amplifier 15 are coupled to the post-sensing amplifier 20 on the bus lines 18 and 19. For example, in one embodiment, each of the memory strips includes eight megabits (8 M) of flash memory, such that the number of strips will determine the total memory included within the flash memory device 10. For example, if four strips are present, then 32 M of memory would be available in device 10. Similarly if eight such strips 11 are present in device 10, then 64 M of memory would be available.

Also, it is to be noted that each strip will have a number of pre-sense amps 15, which number depends on the number of data lines being read. For example, if the memory block is a 64 bit array (that is n=64), then there will be at least 64 pre-sense amps 15 on that strip 11. Similarly, the number of differential output line pairs 18, 19 will also correspond to the number of data line pairs 16, 17 and the number of post-sense amps 20 will also correspond to the number of line pairs 18, 19.

As will be described below, each pre-sense amp 15 receives the output of the memory block as a differential input and provides a differential output on the bus pairs 18 and 19. Each post-sensing amplifier 20 receives differential inputs from the line pairs 18 and 19 and generally generates a single-ended output on bus 21 as an output from the memory device 10. Again, the total number of data lines 21 is dependent on the number of post-sense amps 20 that are present. In many applications, the output on lines 21 from the memory device 10 are coupled to various other devices, including a processor which utilizes the data output from the memory device 10. The output from the post sensing amplifier 20, although could be a differential output, is shown in FIG. 1 as a single-ended output, so that device 10 can readily replace existing flash memory devices which provide a single-ended output to other chips which utilize the flash memory.

Figure 2:
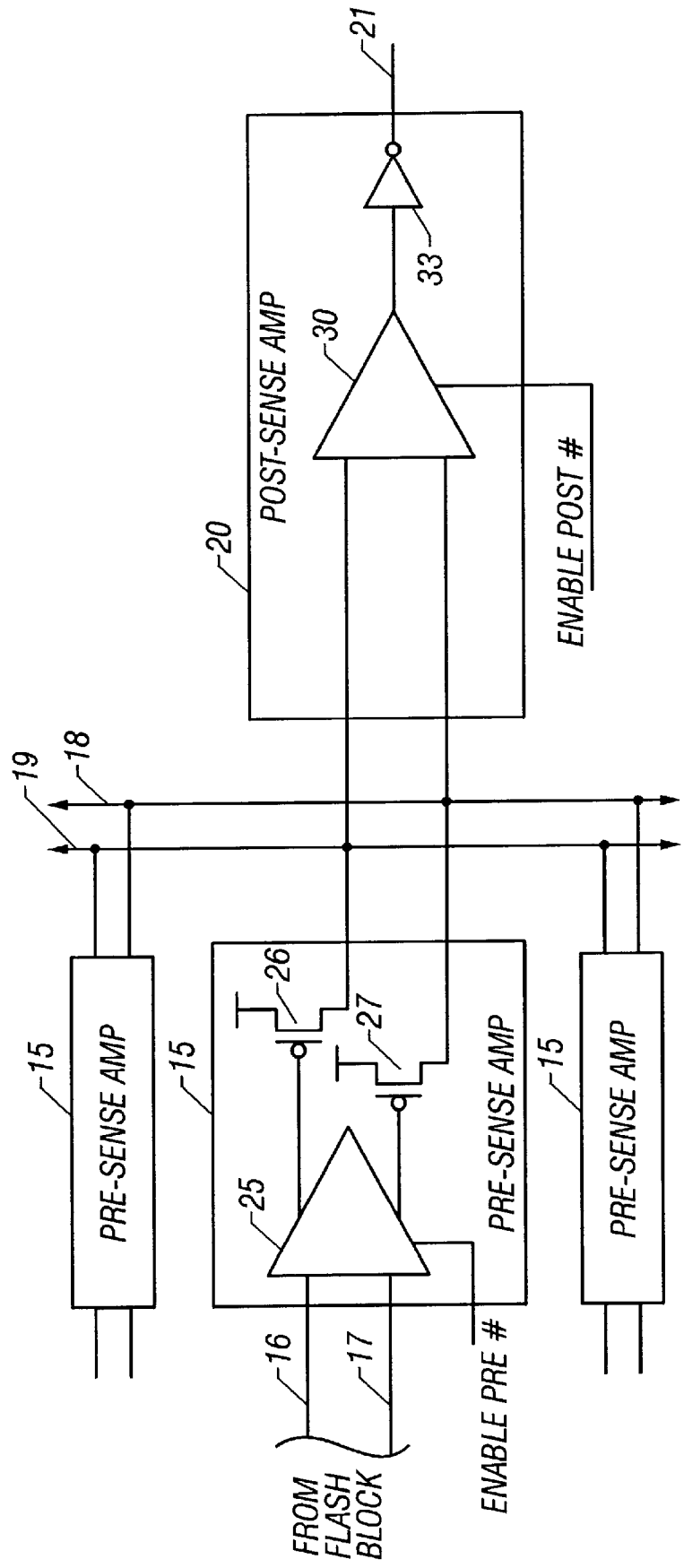
FIG. 2 illustrates one embodiment of the present invention in which a differential pre-sensing amplifier is used to drive differential output lines.

Also referring to FIG. 2, the circuitry utilized in the pre-sensing amplifier 15 and the post-sensing amplifier 20 are shown. Each pre-sensing amplifier 15 includes a differential amplifier 25 coupled to receive the outputs from the memory array as differential inputs when a given memory block 12 is sensed. The sensing of the memory array is essentially a read operation in which the content of the addressed memory cells are read. Flash memories generally are read to determine if the particular memory cell is programmed or erased. In one embodiment, the input to a given differential amplifier 25 is obtained by having an output from a memory cell being read on one of the input line (for example, line 16) while an output from a reference cell (having a known reference value) is read on the other corresponding line (for example, line 17).

The amplifier 25 outputs a differential signal on to the line pair 18, 19 through transistors 26, 27. In the particular example, the outputs of the differential amplifier 25 are coupled to the gates of transistors 26, 27, which in this example are P-type devices. Transistors 26, 27 operate as pull-up transistors to drive the differential read signal from the memory cells onto the output lines 18, 19. As noted in FIG. 2, each of the pre-sense amps 15 has the output coupled onto line pairs 18, 19 through a pair of P-type transistors when the pre-sense amp 15 is activated by an enable signal, EnablePre#.

Each post-sensing amplifier 20 includes an amplifier 30 which has its inputs coupled to the line pairs 18, 19. The output of the amplifier 30 is coupled through a driver 33 to provide an output on line 21. It is appreciated that the output of the amplifier 30 could be made a differential output, but is shown as a single-ended output so that the flash device 10 could readily be substituted for a variety of single ended flash memory devices currently in use.

Figure 3:
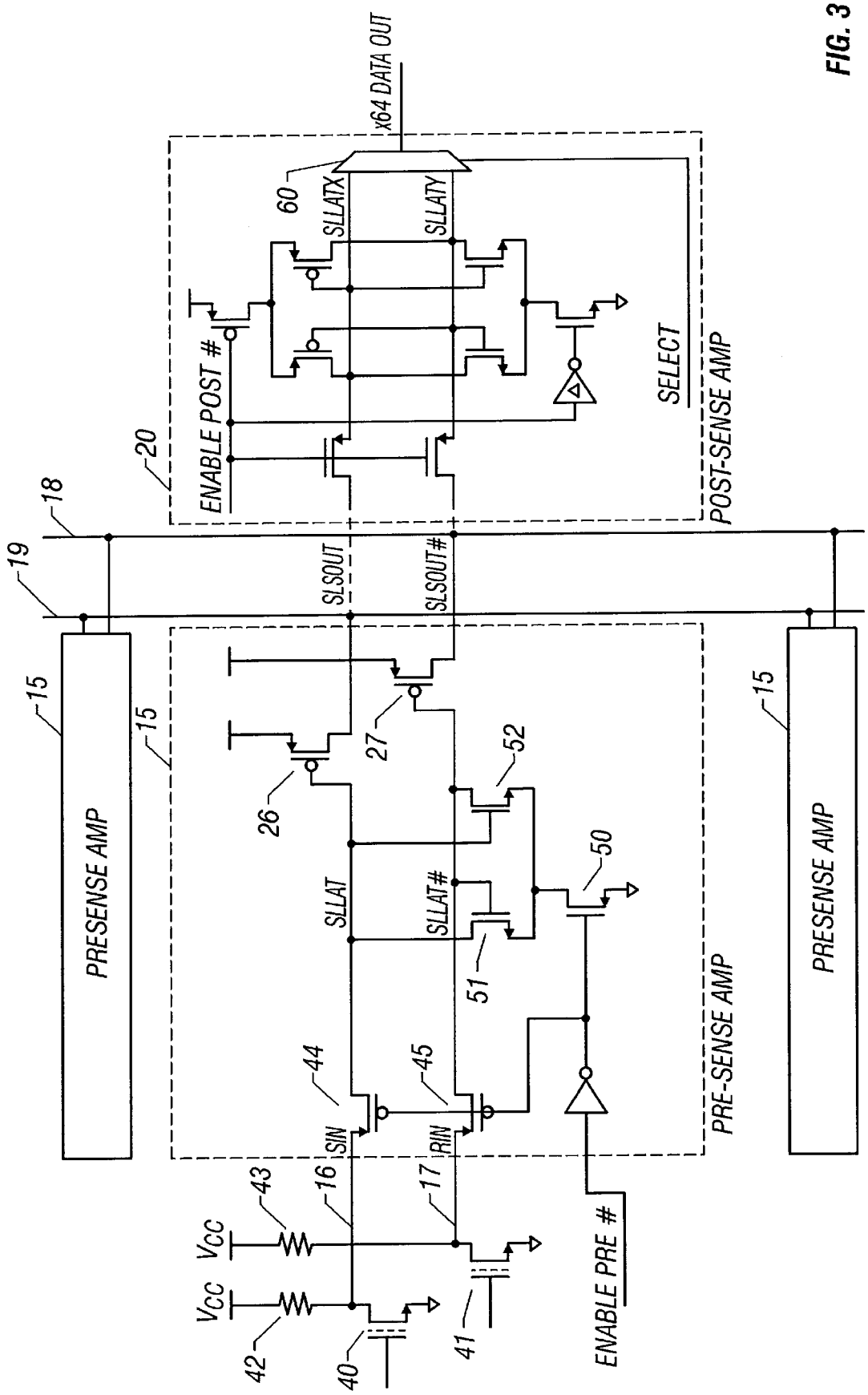
FIG. 3 illustrates an expanded circuit diagram for the embodiment of FIG. 2.
Figure 4:
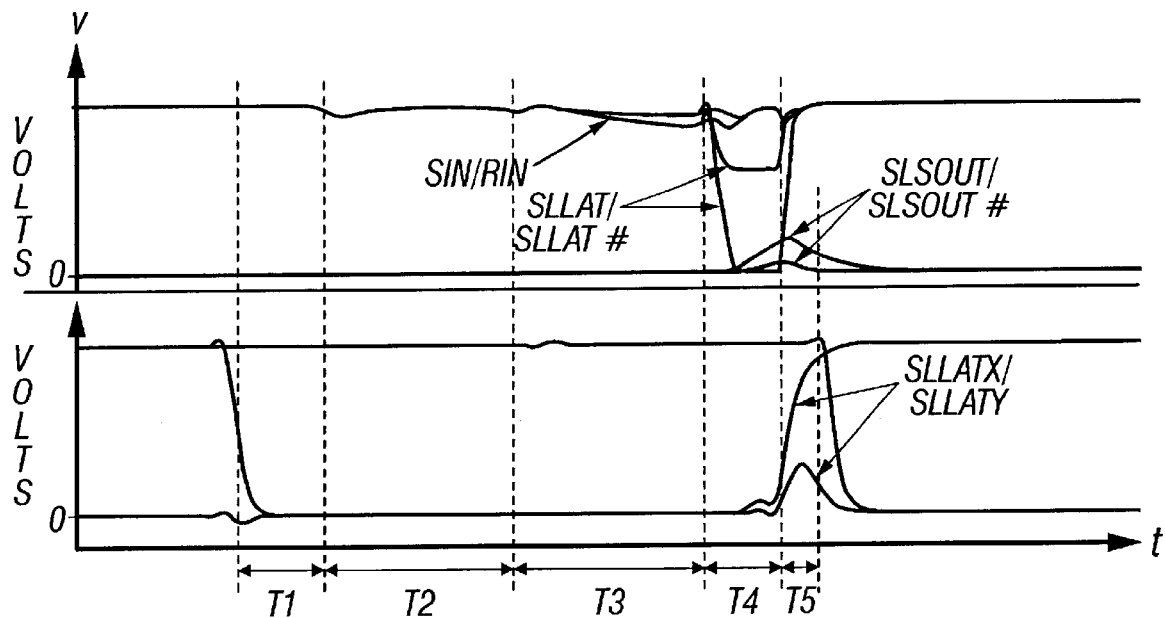
FIG. 4 is a timing diagram showing the timing of the various signal nodes illustrated in FIG. 3.

As shown in FIG. 2, the enable signal EnablePre# is used to enable the differential amplifier 25 in the pre-sense amp 15. Equivalently, an enable signal, EnablePost#, is used to enable amplifier 30 in the post-sense amp 20. The two enable signals, which are described in more detail below, are used to enable each of the sense amps 15, 20 respectively, so that these amplifiers 15, 20 operate as a latch in latching the memory output onto the line pairs 18, 19 and then to the output line 21. It is also appreciated that the "#" sign is utilized herein to denote either a compliment condition (such as activation on low signal condition) and/or the complimentary line of the differential pair. Also referring to FIGS. 3 and 4, FIG. 3 shows a more detailed circuit diagram for the pre-sense amplifier 15 and the post-sense amplifier 20. FIG. 4 shows waveform diagrams pertaining to signals on nodes associated with the sense amplifiers 15, 20.

The embodiment shown in FIG. 3 is better understood when referenced with the timing diagram of the various signals (shown in FIG. 4). A particular flash memory cell which is to be read for its content is shown as transistor 40. Transistor 40 is a typical flash memory cell having a floating gate, control gate, drain and source. Transistor 41 depicts a reference cell for setting a reference level for reading transistor 40. The drains of both of the transistors (also referred to herein as cells) 40, 41 are coupled to respective differential inputs of the amplifier 25 in the pre-sense amp 15. In the timing diagram, a read access commences at time T1.

In the particular embodiment shown, during time T1, the local bitlines are discharged, in which SLSOUT and SLSOUT# signal nodes are grounded. Both of the sense amplifiers 15, 20 are disabled. During time T2, the differential input lines 16, 17 noted by signal SIN (sense in) and its differential counterpart RIN (reference in) are precharged to $V_{cc}$ through resisters 42, 43 each respectively coupled to the drains of the memory cells 40, 41. The SIN and RIN signals are respectively coupled through P-type transistors 44, 45 to provide SLLAT and SLLAT# signals, which are respectively coupled to the gates of the P-type transistors 26, 27, which outputs are then coupled to the line pairs 18, 19. The signal onto line pairs 18, 19 are denoted as SLSOUT and SLSOUT#, respectively.

The enabling and disabling of each of the sense amplifiers 15, 20 are controlled by the EnablePre# and EnablePost#. The EnablePre# signal activates N-type transistor 50 which allows N-type transistors 51 and 52 to conduct. Thus, as shown in FIG. 4, through time T2, the signal nodes for SIN, RIN, SLLAT and SLLAT# are precharged to a $V_{cc}$ level, while signal nodes for SLSOUT and SLSOUT# are at or near zero.

At some point after the commencement of the read sequence during time T3, a differential voltage develops between the SIN and RIN signals. A difference voltage (or margin) is noted due to the conduction of transistors 40 and 41 during T3 when the control gates of these respective transistors turn on the transistors 40 and 41. The difference in the threshold voltages of the transistors 40, 41 cause the transistors to have different voltages at the SIN/RIN differential inputs to the pre-sense amplifier 15. This difference in the voltage is exemplified in the SIN/RIN signals at time T3. Since the SIN/RIN inputs are shorted through the transistors 44, 45 to the SLLAT/SLLAT# nodes respectively, when the EnablePre# goes low at the end of time T3, the SLLAT and the SLLAT# nodes are disconnected from the SIN/RIN inputs and the sense amplifier 15 amplifies the difference between the SLLAT and SLLAT# differential nodes.

At the same time that the pre-sensing amplifier 15 is enabled by EnablePre#, the output lines 18, 19 are removed from a grounded state to a tri-state condition. Although not shown, generally a device grounds lines 18, 19 to maintain the lines 18 and 19 at a disabled or zero volt condition until the end of period T2. Once the lines 18, 19 are tri-stated, they are now available to respond to the differential signal from the activated pre-sense amp 15. The voltages on SLLAT/SLLAT# turn on the P-device output drivers 26, 27 to provide a differential output on lines 18, 19. Generally one of the P-devices 26 or 27 will be barely on while the other will have full VCC potential across its gate. This difference in drive causes a different ramp rate on SLSOUT and SLSOUT#, allowing a differential voltage to develop across and latch onto these nodes, as shown in time T4. The differential signal is sensed and latched during time period T5 by the post-sense amp 20 when Enable Post# is driven to ground. The latched output of the post-sense amp 20 is illustrated by the signals SLLATX and SLLATY during time T5.

As is described above, during time T4 when the pre-sense amp 15 is activated, the difference in voltage sensed by the differential inputs SIN and RIN are amplified as noted by signals SLLAT and SLLAT#. The bus lines 18, 19 coupling the output of all of the sense amplifiers 15 will respond by noting the difference of the differential voltage SLLAT and SLLAT#. However, since the SLSOUT signal is referenced to its compliment and sensed differentially, the differential lines 18, 19 need only transition a smaller voltage before it is sensed by the post sensing amplifier 20. This is exemplified by the difference in the amplitude of the SLSOUT and SLSOUT# signal during time T4.

Generally, a difference in the range of 50–200 millivolts between SLSOUT and SLSOUT# is adequate for providing the sensing output. The sensing could be available at a lower limit such as at 20 millivolts, but care must be taken that at the time of sensing the signal, an adequately measurable amplitude difference is present to ensure that a valid read is obtained from the memory cell. Furthermore, the sensing can be obtained at a higher voltage beyond 200 millivolts, but it could detract from the performance of the device if longer time is required to sense the voltage. Accordingly, a range of 50–200 millivolts provides adequate differential voltage to obtain proper reading of the memory cell, but with a minimal time period once the signals difference is noted.

As noted, since the power required to charge the output node of the pre-sense amp 15 is proportional to the magnitude of the transition voltage that it transitions and the capacitance of the node, limiting the voltage swing on lines 18, 19 reduces the amount of power required to put an output onto lines 18 and 19.

In the example illustrated, the memory cells provide a 64 bit output such that there will be 64 such pre-sensing amplifiers 15 for each of the memory strips 11. Accordingly, when small transitions are encountered with the differential sense amp of the present invention, smaller power requirements per line will make a significant difference in the total power when 64 lines are involved. In the particular example of a 64 bit data bus, the differential output onto bus lines 18, 19 can provide approximately 2 milliamp of read power savings which in some instances may be 10 percent of the total read power required for the device.

Furthermore, the limited voltage swing of the differential bus 18, 19 can also provide a performance benefit in the area of speed performance. Since the signal is referenced to its differential compliment it can be timed to be sensed when it has transitioned approximately 50–200 millivolts. This is in contrast to a digital signal which typically transitions at one half of the power supply voltage (or rail voltage) on average in order to sense valid data from a memory cell. The reduced transition time for sensing the memory cell provides considerable improvement in the performance of the memory device 10.

Furthermore, since the sense amplifiers are placed on each individual strip 11, only one overall post-sensing amplifier 20 per line is required for all of the memory strips 11. Since the output driver of the pre-sensing amplifier 15 is a single P-device for each line (shown by transistors 26 and 27) the circuitry is considerably smaller than the alternative implementation known in the prior art, which typically uses a tri-state inverter which is adequately large to drive several picofarads of load. In the present case, the P-type transistors 26 and 27 are of smaller capacitance and provides a much smaller load on each of the sense amplifiers 15.

It is also to be noted that in the embodiment shown in FIG. 3, a multiplexor 60 is utilized to select one of the SLLATX or SLLATY from the post-sense amp 20 to provide a single-ended output from amp 20. A Select signal is used to select the output. Although a particular circuit is shown for the post-sense amp 20, a variety of prior art sense amps utilized for sensing outputs from memories can be used for post-sense-amp 20.

Figure 5:
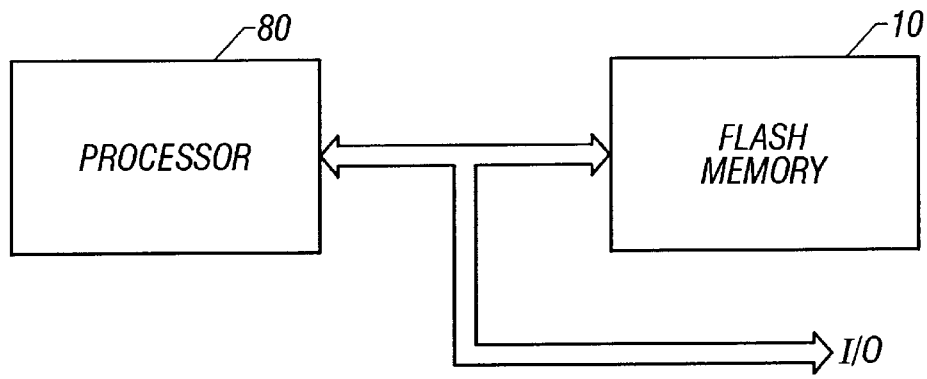
FIG. 5 is a block schematic diagram showing one system utilization for the flash memory device incorporating the present invention.

Referring to FIG. 5, it is appreciated that the flash memory device 10 of the present invention can be utilized in a variety of different capacities. One system is shown in FIG. 5 in which the flash memory device 10 is coupled to a processor 50. The processor controls the operation of the flash memory 10 as well as utilizing the data present in the flash memory 10. In general application, the processor along with the flash memory is coupled to other devices (here shown as I/O, input/output) to exemplify a system in which a processor 50 and flash memory 10 are utilized. A variety of other configurations and systems can be devised in order to utilize the flash memory device 10 incorporating the present invention.

Thus, a differential signal path for high speed data transmission in flash memory is described.

We claim:

1. An apparatus comprising:

a flash memory array;

a first sensing amplifier coupled to receive differential inputs from said flash memory array and generate a differential output comprising a first signal and a second signal, wherein said first sensing amplifier limits a difference in amplitude between said first and second signals to less than half of a supply voltage; and a second sensing amplifier coupled to receive the differential output from said first sensing amplifier and generate a sensing output of said flash memory array.

2. The apparatus of claim 1 in which said first sensing amplifier senses a marginal difference in the differential input from said flash memory array to generate the differential output also of marginal difference, which is then sensed by said second sensing amplifier to generate a logic level output as the sensing output.

3. The apparatus of claim 2 in which a plurality of first sensing amplifiers have their differential outputs coupled together as inputs to said second sensing amplifier.

4. The apparatus of claim 2 in which the marginal difference in the differential output is in the approximate range of 50 mV–200 mV.

5. A flash memory comprising:

a flash memory array;

a pre-sensing amplifier coupled to receive differential inputs from a pair of memory cells of said flash memory array and generate a differential output comprising a first signal and a second signal, and wherein said pre-sensing amplifier limits a difference in amplitude between said first and second signals to less than half of a supply voltage;

a differential output bus coupled to receive the differential output from said pre-sensing amplifier; and a post-sensing amplifier coupled to said differential output bus to receive the differential output from said pre-sensing amplifier and generate a sensing output of said flash memory array.

6. The flash memory of claim 5 in which said pre-sensing amplifier senses a marginal difference in the differential input from said memory cells and to generate the differential output also of marginal difference, which is then sensed by the post-sensing amplifier to generate a logic level output as the sensing output.

7. The flash memory of claim 6 in which the marginal difference in the differential output is in the approximate range of 50 mV–200 mV.

8. The flash memory of claim 6 in which said pre-sensing amplifier includes a pair of p-type transistors at its input stage to couple sensed signals from the pair of memory cells.

9. The flash memory of claim 7 in which said pre-sensing amplifier includes a pair of p-type transistors configured as a pull-up at its output stage to couple the differential output onto the differential output bus.

10. The flash memory of claim 9 in which a plurality of pre-sensing amplifiers have their differential outputs coupled onto said output bus, but without loading down the output bus when tied together as inputs to said post-sensing amplifier.

11. The flash memory of claim 10 further comprising a plurality of memory strips in which each memory strip includes at least one memory array and said pre-sensing amplifier and said post-sensing amplifier coupled to receive differential outputs from said plurality of memory strips.

12. The flash memory of claim 11 in which the marginal difference in the differential output is in the approximate range of 50 mV–200 mV.

13. A method comprising:
sensing a state of a memory cell as a differential input to a pre-sensing stage, which pre-sensing stage senses a marginal voltage difference;
generating a differential output from the pre-sensing stage in response to the differential input, said differential output having a first signal and a second signal, wherein said pre-sensing stage limits a difference in amplitude between said first and second signals of said differential output to marginal voltage difference of less than half of a supply voltage;
generating a logic output from a post-sensing stage in response to the differential output from the pre-sensing stage.

14. The method of claim 13 in which the marginal voltage difference of the differential output is sufficiently small to allow the logic output to be generated without the differential output reaching approximately half of the supply voltage.

15. The method of claim 14 in which the marginal difference in the differential output is in the approximate range of 50 mV–200 mV.

16. The method of claim 14 wherein said difference in amplitude between said first and second signals differential output is limited to 200 millivolts (mV) or less.

17. The apparatus of claim 3 wherein said first sensing amplifier limits said difference in said amplitude between said first and second signals to 200 millivolts (mV) or less.

18. The flash memory of claim 11 wherein said pre-sensing amplifier limits said difference in said amplitude between said first and second signals to 200 millivolts (mV) or less.

* * * * *